(12) United States Patent
Zien

(10) Patent No.: US 8,146,374 B1
(45) Date of Patent: Apr. 3, 2012

(54) SYSTEM AND METHOD FOR EFFICIENT UTILIZATION OF ENERGY GENERATED BY A UTILITY PLANT

(75) Inventor: Herbert B. Zien, Milwaukee, WI (US)

(73) Assignee: Source IT Energy, LLC, Boston, MA (US)

( * ) Notice: Subject to any disclaimer, the term of this patent is extended or adjusted under 35 U.S.C. 154(b) by 675 days.

(21) Appl. No.: 12/371,344

(22) Filed: Feb. 13, 2009

(51) Int. Cl.
*F25B 15/00* (2006.01)
(52) U.S. Cl. .......................................... 62/101; 62/238.3
(58) Field of Classification Search .................... 62/101, 62/118, 238.3, 476, 481, 483, 495, 435
See application file for complete search history.

(56) References Cited

U.S. PATENT DOCUMENTS

| | | | | |
|---|---|---|---|---|
| 4,936,109 A * | 6/1990 | Longardner | ................ | 62/238.3 |
| 5,038,574 A * | 8/1991 | Osborne | ........................ | 62/101 |
| 5,467,609 A * | 11/1995 | Feeney | ........................ | 62/259.2 |
| 7,067,208 B2 | 6/2006 | Gottmann et al. | | |
| 7,141,894 B2 | 11/2006 | Kraus | | |
| 7,534,167 B2 * | 5/2009 | Day | .............. | 454/187 |
| 7,809,538 B2 * | 10/2010 | Thomas | ........................ | 703/10 |
| 7,831,694 B2 * | 11/2010 | Wadhawan | ................ | 709/220 |
| 7,957,142 B2 * | 6/2011 | Noteboom et al. | ........... | 361/696 |
| 2004/0264124 A1 * | 12/2004 | Patel et al. | ................ | 361/686 |
| 2005/0200205 A1 | 9/2005 | Winn et al. | | |
| 2005/0247433 A1 * | 11/2005 | Corrado et al. | .............. | 165/80.4 |
| 2006/0042289 A1 * | 3/2006 | Campbell et al. | ........... | 62/259.2 |
| 2006/0107674 A1 * | 5/2006 | Sharma et al. | .............. | 62/238.3 |
| 2006/0126296 A1 * | 6/2006 | Campbell et al. | ............ | 361/700 |
| 2006/0161450 A1 * | 7/2006 | Carey et al. | ........................ | 705/1 |
| 2007/0052297 A1 | 3/2007 | Nagai | | |
| 2007/0074525 A1 * | 4/2007 | Vinson et al. | ................ | 62/259.2 |
| 2007/0074537 A1 * | 4/2007 | Bean et al. | ........................ | 62/513 |
| 2007/0167125 A1 * | 7/2007 | Rasmussen et al. | .......... | 454/184 |
| 2007/0271039 A1 * | 11/2007 | Ella et al. | ........................ | 702/12 |
| 2008/0018175 A1 | 1/2008 | McNamara et al. | | |
| 2008/0029250 A1 | 2/2008 | Carlson et al. | | |
| 2008/0094797 A1 | 4/2008 | Coglitore et al. | | |
| 2008/0208478 A1 * | 8/2008 | Ella et al. | ........................ | 702/11 |
| 2008/0209234 A1 | 8/2008 | Clidaras et al. | | |
| 2008/0266726 A1 * | 10/2008 | Murakami et al. | ................ | 361/1 |
| 2008/0307806 A1 * | 12/2008 | Campbell et al. | .............. | 62/121 |
| 2009/0021078 A1 * | 1/2009 | Corhodzic et al. | .............. | 307/67 |
| 2009/0078401 A1 | 3/2009 | Cichanowicz | | |

OTHER PUBLICATIONS

Annual Energy Review 2008, Energy Information Administration, 446 pp.
Robert L. Mitchell, Power Trip: The case for cogeneration, ComputerWorld, Aug. 21, 2007, http://www.computerworld.com/s/article/9031539/Power_trip_The_case_for_cogeneration, 3 pp.
Whitney Stone, Think Different: Alternative Power in the Data Center, http://www.facilitiesnet.com/bom/article.asp?id=8228, facilitiesnet, Feb. 2008, 5 pp.

(Continued)

*Primary Examiner* — Mohammad Ali
(74) *Attorney, Agent, or Firm* — Foley & Lardner LLP

(57) ABSTRACT

A system and method for improving the efficiency of an existing utility plant by constructing a data center nearby and retrofitting the utility plant to provide electric power and cooling to the data center. The system and method for cooling the data center uses a cooling fluid cooled using energy obtained from a heating fluid. The heating fluid is received from the utility plant. The system and method uses the cooling fluid to dissipate heat from electrical components contained in the data center, including a plurality of computer servers.

26 Claims, 7 Drawing Sheets

OTHER PUBLICATIONS

Alex Preston, Cogeneration and the datacenter, DatacenterDynamics Focus Magazine, The International Data Center Design and Management Magazine, May 7, 2008, 6 pp.

William Forrest et al., Data centers: How to cut carbon emissions and costs, McKinsey on Business Technology, Winter 2008, McKinsey & Company, USA, 10 pp.

Ken Darrow et al., Opportunities for Combined Heat and Power in Data Centers, Paper prepared for Oak Ridge National Laboratory by ICF International, Mar. 2009, 64 pp.

Report to Congress on Server and Data Center Energy Efficiency, Public Law 109-431, U.S. Environmental Protection Agency, Energy Star Program, Aug. 2, 2007, 134 pp.

Combined Heat and Power: Energy Savings and Energy Reliability for Data Centers, EPA Combined Heat and Power Partnership ("CHP"), Oct. 2008, 4 pp.

Robert Tozer, Developing a viable data center energy strategy, HP Critical Facilities Services delivered by EYP Mission Critical Facilities, www.datacenterdynamics.com, 3 pp.

Ambrose McNevin, 1.21 Sum of All Things?, Focus Feature Measurement, Issue 1, Dec. 2008, www.datacenterdynamics.com, 4 pp.

Randy H. Katz, Tech Titans Building Boom, IEEE Spectrum, Feb. 2009, 8 pp.

Server Technology, Inc., Measuring Power & Efficiency in the "Green" Data Center, White Paper STI-100-006, 2009 Server Technology, Inc., 16 pp.

* cited by examiner

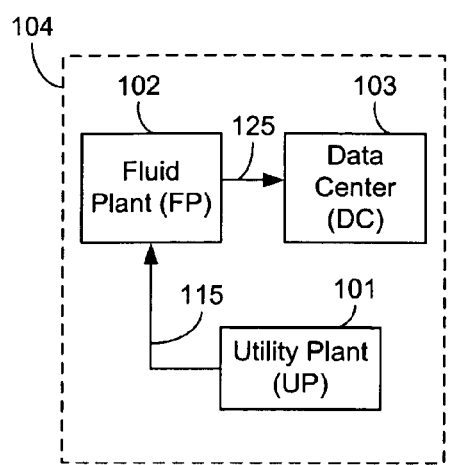
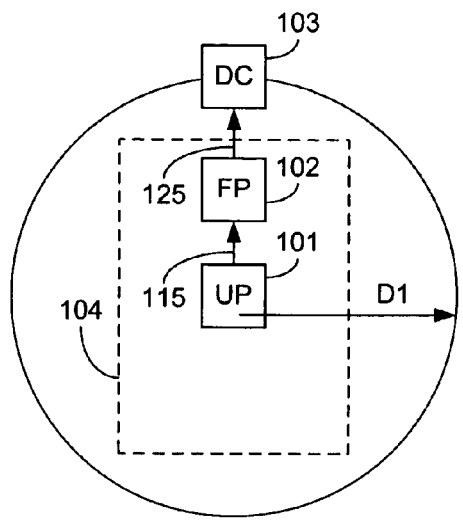
FIG. 1A
FIG. 1B
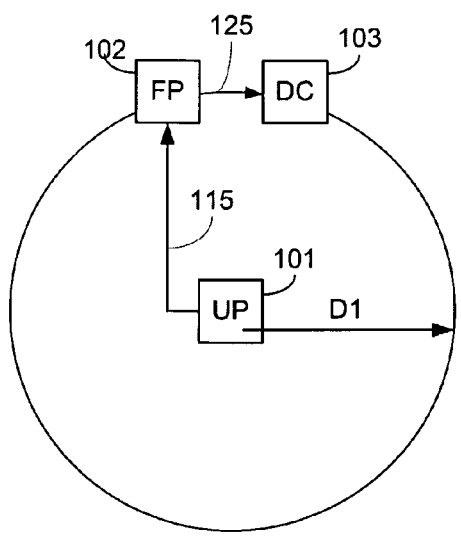
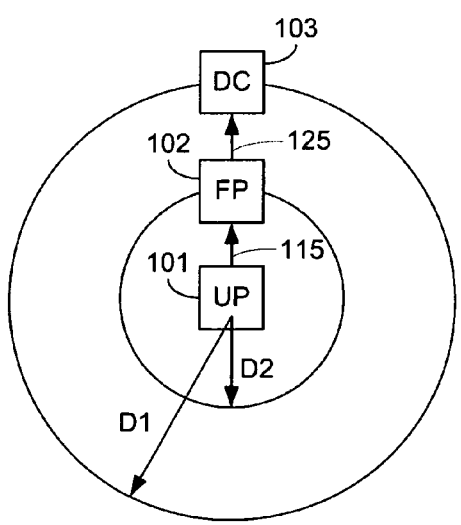
FIG. 1C
FIG. 1D

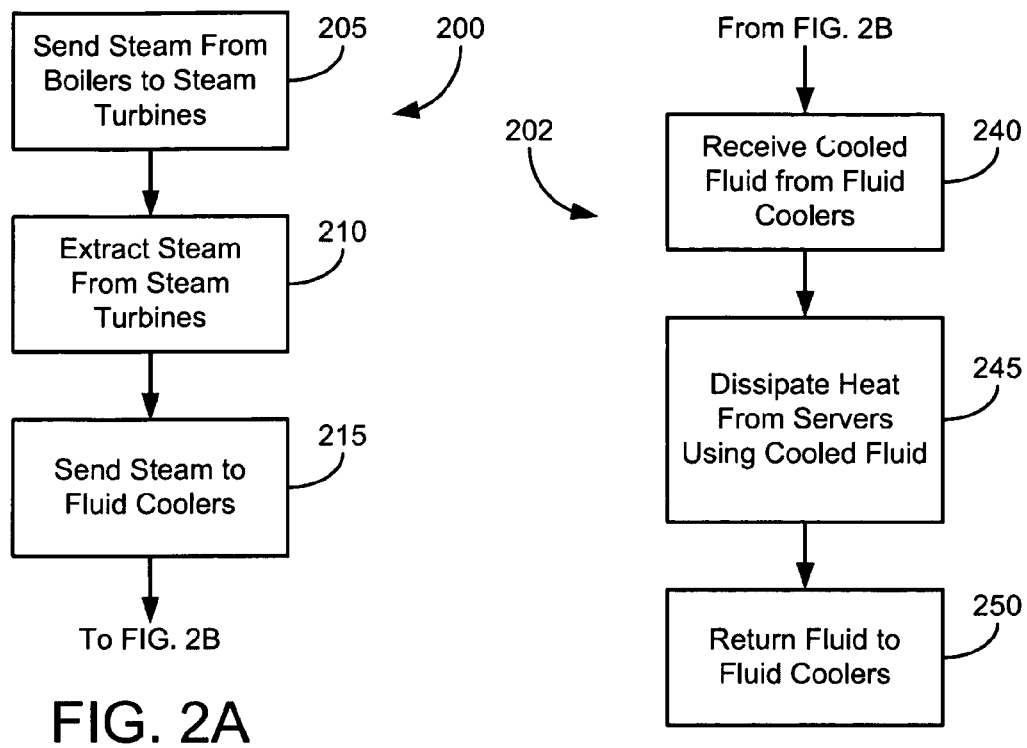
FIG. 2A
FIG. 2C
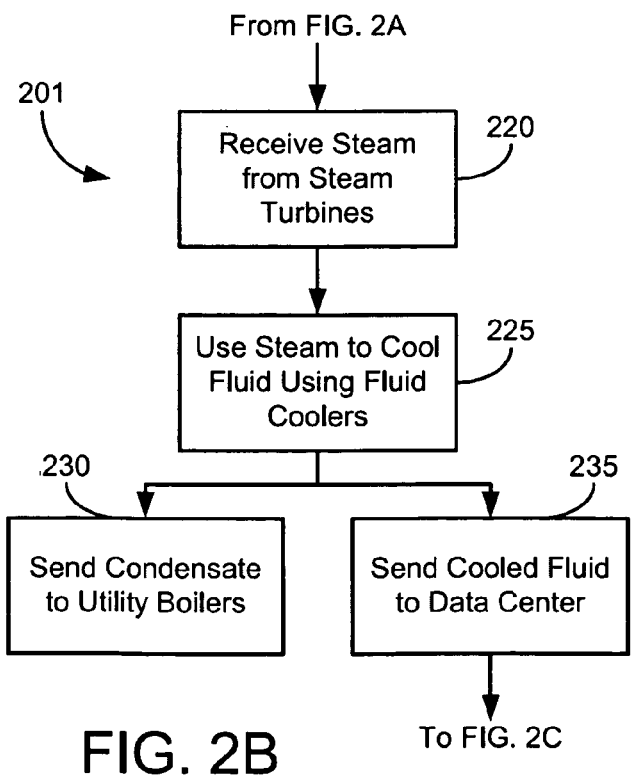
FIG. 2B

SYSTEM AND METHOD FOR EFFICIENT UTILIZATION OF ENERGY GENERATED BY A UTILITY PLANT

BACKGROUND OF THE INVENTION

The present disclosure relates generally to utility plants that generate electric power. More specifically, the present disclosure relates to a system and method for efficiently utilizing energy from such a utility plant.

The generation and transmission of electric energy from a utility plant is an inherently inefficient process. For example, in order to generate electricity from coal, coal is burned in a boiler to convert water to steam, which is then used to drive steam turbines. The steam turbines are coupled to generators that produce electricity, and the electricity is transmitted over electric power lines in this process. Further losses are incurred in converting the electricity to voltages suitable for transmission over long distances, transmitting the electricity over electric power lines over such distances, and then converting the electricity to voltages suitable for utilization by a consumer. Accordingly, typically, only about 30% of the energy value in the fuel consumed by a power plant actually is delivered to an end user.

SUMMARY OF THE INVENTION

One embodiment of the disclosure relates to a method of retrofitting a utility plant. The method comprises constructing a data center within three miles of the utility plant. The utility plant distributes an average of at least fifty percent of the electrical power it generates to a power grid. The utility plant was commissioned before the construction of the data center begins. The method further comprises installing a first pipe system configured to divert a heating fluid from the utility plant to a fluid plant that uses the heating fluid to produce a cooling fluid. The method further comprises installing a second pipe system to connect the fluid plant to a data center and to circulate the cooling fluid between the fluid plant and the data center. Plans for the utility plant submitted for regulatory approval before the utility plant was commissioned do not include the pipe system configured to divert the heating fluid from the utility plant to the fluid plant. The data center comprises electrical components including a plurality of servers. The electrical components contained in the data center generate heat that is dissipated using the cooling fluid. The computer servers are configured to execute instructions and store and access data in a memory. The computer servers are connected to a computing network.

Another embodiment of the disclosure relates to a system. The system comprises an enclosure located adjacent to a utility plant and configured to contain a plurality of electrical components. The utility plant is a preexisting utility plant that was commissioned before the beginning of construction of the enclosure. The utility plant operates on average at least eighty percent of the time. The electrical components include a plurality of computer servers configured to execute instructions and store and access data in a memory. The computer servers are connected to a computing network. The system further comprises a cooling system configured to dissipate heat from the electrical components using a cooling fluid. The cooling fluid is received from a fluid cooler configured to cool the cooling fluid using thermal energy obtained from a heating fluid. The heating fluid is received by the fluid cooler from the utility plant. The utility plant is retrofitted to provide heating fluid to the fluid cooler and plans for the utility plant submitted for regulatory approval before the utility plant was commissioned do not include a pipe system configured to transport heating fluid from the utility plant to the fluid cooler.

Another embodiment of the disclosure relates to a system for using steam from a utility plant. The system comprises a data center configured to contain a plurality of electrical components. The electrical components include a plurality of computer servers configured to execute instructions and store and access data in a memory. The computer servers are connected to a computing network. The data center is located adjacent to the utility plant at a distance less than about three miles from the utility plant. The utility plant is a preexisting utility plant that was commissioned prior to the construction of the data center. The utility plant operates on average at least eighty percent of the time. The utility plant is configured to generate at least 50 Megawatts of electrical power. The utility plant distributes on average at least fifty percent of the electrical power it generates to a power grid. The system further comprises a water plant configured to receive low-pressure steam through steam pipes from the utility plant. The low-pressure steam has a pressure of less than about thirty pounds per square inch gauge. The low-pressure steam is extracted from an extraction port at a low-pressure stage of a steam turbine in the utility plant. The water plant is further configured to send the cooled water through chilled water pipes to the data center. The chilled water plant is further configured to send condenser water from the absorption chillers to boilers in the utility plant. The system further comprises a water cooling system configured to receive the chilled water from the water plant and dissipate heat from the electrical components using the chilled water. The water cooling system is further configured to return the water to the water plant for cooling by the absorption chillers. The system further comprises an electrical substation configured to receive electricity to power the electrical components. The electrical substation is further configured to receive electric power via at least one of an electrical line from the utility plant that does not pass through a power grid and an electrical line from a power grid, wherein electric power from the power grid is used if electric power from the utility plant is unavailable. The utility plant is retrofitted and plans for the utility plant submitted for regulatory approval before the utility plant was commissioned do not include the steam pipes from the utility plant to the water plant.

Another embodiment of the disclosure relates to a method of using thermal energy from a utility plant. The method comprises extracting heating fluid at the utility plant. The heating fluid is at least one of steam and hot water. The method further comprises sending the heating fluid to a fluid cooler. The fluid cooler is configured to use the heating fluid to cool water. The water is received by a data center located adjacent to the utility plant. The data center contains electrical components. The chilled water is used to dissipate heat from the electrical components. The electrical components include a plurality of computer servers configured to execute instructions and store and access data in a memory. The computer servers are connected to a computing network. At least fifty percent of the electrical power generated by the utility plant is used by consumers located greater than three miles from the utility plant. The utility plant was commissioned before the beginning of construction of the data center. The utility plant is retrofitted to send the heating fluid from the utility plant to the fluid cooler and plans for the utility plant submitted for regulatory approval before the utility plant was commissioned do not include a pipe for sending the heating fluid from the utility plant to the fluid cooler.

BRIEF DESCRIPTION OF THE FIGURES

The disclosure will become more fully understood from the following detailed description, taken in conjunction with the accompanying figures, wherein like reference numerals refer to like elements, in which:

FIGS. 1A through 1D are block diagrams of a utility plant and possible relative locations of components of a data center cooling system, according to an exemplary embodiment.

FIGS. 2A, 2B and 2C are process flow diagrams of a method of cooling the data center shown in FIG. 1E, according to an exemplary embodiment.

DETAILED DESCRIPTION OF THE PREFERRED EMBODIMENTS

Figure 1E:
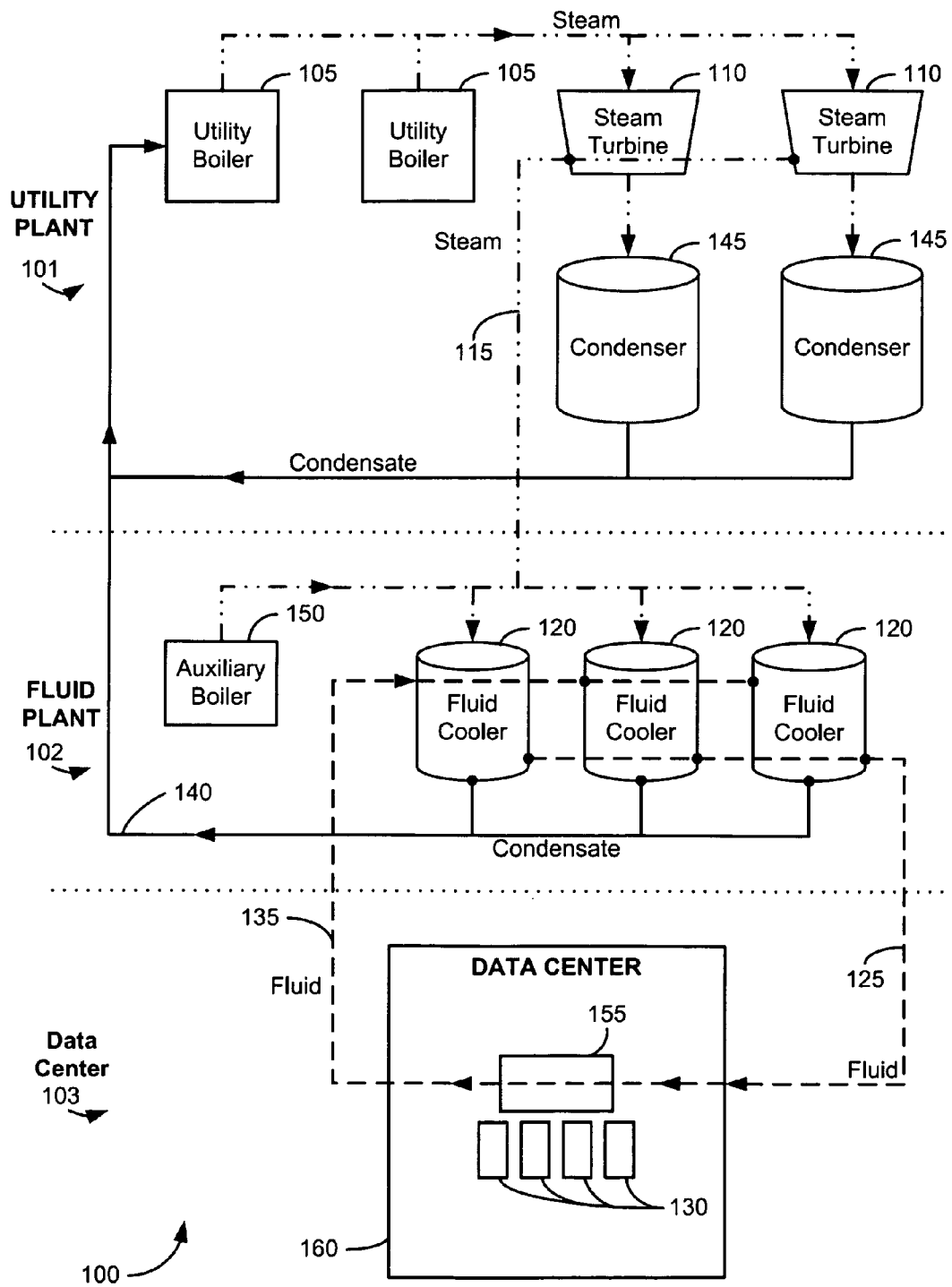
FIG. 1E is a block diagram of a utility plant and a data center cooling system, according to an exemplary embodiment.

Before turning to the figures, which illustrate the exemplary embodiments in detail, it should be understood that the application is not limited to the details or methodology set forth in the following description or illustrated in the figures. It should also be understood that the phraseology and terminology employed herein is for the purpose of description only and should not be regarded as limiting.

Referring now to FIGS. 1A through 1E, block diagrams of a utility plant and a data center cooling system are shown, according to an exemplary embodiment. Data center cooling system 100 includes a data center 103 and a fluid plant 102 that is configured to provide cooled fluid to data center 103 to dissipate heat generated in data center 103. Also shown in the exemplary embodiments of FIGS. 1A through 1E is a utility plant 101. Data center 103 and fluid plant 102 are located adjacent to utility plant 101, and fluid plant 102 is configured to receive a heating fluid, such as steam or hot water, from utility plant 101 for use in cooling the cooling fluid.

Data centers are typically energy intensive facilities and operate around the clock at a relatively steady demand. They can require 100 watts, 150 watts, or more of electric power per square foot of the floor area occupied by electrical components to operate. The electrical components housed in data centers convert much of the electric energy to heat. Hence, while some of this power is used to operate the electrical components, much of this power is also required to dissipate the heat generated by the electrical components. For example, typically, less than forty percent of the electric energy delivered to a data center is used to operate the equipment it contains, while the remaining electric energy delivered to the data center is used to power electric refrigeration equipment needed to dissipate that heat or is lost through inefficiency. By locating data center 103 adjacent to utility plant 101, data center 103 may be more efficiently cooled than if the data center were located remotely from the utility plant. Rather than making use for cooling purposes of electricity transmitted through power lines from the utility plant, data center 103 and fluid plant 102 can use for cooling purposes from utility plant 101 resources such as low-pressure steam or high-temperature hot water. Such resources may be of greater value when used for purposes of cooling data center 103 than when used by utility plant 101 for purposes of generating additional electricity.

Referring now specifically to the exemplary embodiments illustrated in FIGS. 1A through 1D, block diagrams of possible relative locations of components of data center cooling system 100 and utility plant 101 are shown. According to the exemplary embodiment of FIG. 1A, data center 103 and fluid plant 102 may be located on utility plant 101 property and directly next to utility plant 101. Data center 103 and fluid plant 102 may be located within a security fence for utility plant 101 and may share resources, such as security equipment and personnel, engineering and maintenance personnel, etc. In another exemplary embodiment illustrated in FIG. 1B, fluid plant 102 may be located on utility plant 101 property and data center 103 may be located a distance D1 away from utility plant 101. In another exemplary embodiment illustrated in FIG. 1C, fluid plant 102 and data center 103 may both be located at substantially the same distance D1 away from utility plant 101. There is a substantial cost associated with constructing pipes to transport heating fluid between utility plant 101 and fluid plant 102 and transport cooling fluid between fluid plant 102 and data center 103. Accordingly, utility plant 101, fluid plant 102 and data center 103 may be located within a relatively short distance of one another to control this cost. In one embodiment, data center 103 and/or fluid plant 102 may be located within a distance of three miles from utility plant 101. In yet another embodiment, data center 103 and/or fluid plant 102 may be located within a distance of one mile from the utility plant, which may further reduce the expense and difficulty of transporting heating fluid and/or cooling fluid through pipes. In yet another embodiment illustrated in FIG. 1D, fluid plant 102 may be located at a distance D2 from utility plant 101 and data center 103 may be located at a distance D1 from utility plant 101. In the embodiment illustrated in FIG. 1D, D1 is greater than D2 (i.e., data center 103 is further away from utility plant 101 than fluid plant 102), but in other embodiments D2 may be greater than D1. In still further embodiments, data center 103 and/or fluid plant 102 may be located any distance from utility plant 101 at which it is practicable for fluid plant 102 to receive heating fluid from utility plant 101 and data center 103 to receive cooling fluid from fluid plant 102.

Referring now specifically to FIG. 1E, a block diagram of a data center cooling system is shown, according to an exemplary embodiment. Data center 103 is generally configured to facilitate computing functions as well as data communication and storage functions. Data center 103 includes a building or enclosure 160 which contains a plurality of electrical components 130. Electrical components 130 include a plurality of computer servers that each include one or more processors and a computer-readable medium (e.g., memory) that stores executable instructions (e.g., software). Electrical components 130 may also include transformers, switchgear and other electrical components used to support the operation of data center 103. The servers are configured to execute the software and to store and access data in memory. The computer servers are connected to a computing network, such as the Internet, wide area networks, and other types of computing networks. For example, the computer servers may be used to provide services that are accessed through the world wide web, such as search engines, on-line shopping, on-line banking, on-line media distribution (e.g., online movies, online newspapers/magazines, on-line music downloads, online radio broadcasting, and so on), on-line file storage (FTP file transfer, etc.), on-line gaming, and so on. The servers may also be used to support enterprise computing systems accessible through secure intranet connections. Electrical components 130 may also include other electrical devices, such as telecommunications devices, backup power supplies such as uninterruptible power supplies and generators, redundant data devices such as a backup memory, environmental controls such as air conditioning and fire prevention devices, security devices such as biometric devices and keypads, etc.

Data center 103 also includes a cooling system 155 configured to dissipate heat created by electrical components 130. As electrical components 130 operate, they may generate substantial heat. Electrical components 130 may require a particular temperature range to ensure continued operation and/or prevent damage. Accordingly, the heat generated by electrical components 130 may need to be removed from data center 103. Cooling system 155 is configured to dissipate this heat using cooling fluid received from fluid plant 102. Cooling fluid is received from fluid plant 102 through fluid pipe 125, used by cooling system 155 to dissipate heat from electrical components 130, and then returned to fluid plant 102 through fluid pipe 135. In one embodiment, the cooling fluid being sent to data center 103 through fluid pipe 125 may be between forty and sixty degrees Fahrenheit, and the cooling fluid being returned to fluid plant 102 through fluid pipe 135 may be twenty to forty degrees Fahrenheit warmer. While fluid pipes 125 and 135 are illustrated as single pipes in the exemplary embodiment shown in FIGS. 1A through 1E, it should be appreciated that each of fluid pipes 125 and 135 may include one or more pipes through which cooling fluid is transported. The operation of cooling system 155 will be described in greater detail herein with respect to FIG. 2C.

Utility plant 101 is generally configured to use steam or another energy source to generate electrical power. Utility plant 101 may be owned by several different types of utility companies, including an investor-owned utility, municipal utility, independent power producer, waste-to-energy company, etc. Utility plant 101 is a central station electrical generation plant, as opposed to a distributed generation plant. Central station generation plants are configured to generate larger amounts of electrical power than distributed generation plants. In some embodiments, utility plant 101 may generate 50, 100, or 150 Megawatts of electrical power or more. Central station generation plants are also configured to transmit electrical power at a higher voltage than distributed generation plants. In some embodiments, utility plant 101 may transmit electrical power at voltages at or above 15,000 volts, while distributed generation plants typically distribute electrical power at or below 13,600 volts. Central station generation plants are generally configured to provide this larger amount of electrical power to a greater number of consumers via a transmission voltage power grid (described in greater detail with reference to FIG. 3). Utility plant 101 may be configured to transmit, on average, more than fifty percent of the electrical power it generates to a transmission voltage power grid, In some embodiments and at some times, utility plant 101 may transmit as much as ninety percent or more of its generated electrical power to a power grid. Utility plant 101 may be configured to distribute, on average, less than fifty percent of the electrical power it generates to data center 103. In some embodiments and at some times, utility plant 101 may transmit as little as five percent or less of its generated electrical power to data center 103. The customers of a central station generation plant may span a large geographic area. In some embodiments, at least fifty percent of the electrical power generated by utility plant 101 may be used by consumers located more than three miles from utility plant 101. The primary purpose of central station generation plants is to generate electrical power for use by many, often non-local, entities. Central station generation plants are base load power plants that must be running the majority of the time to meet customer demands. Utility plant 101 may be a base load power plant that operates at least 80% of the time.

In some embodiments, utility plant 101 may be a preexisting utility plant that is retrofitted or modified to facilitate the disclosed cogeneration system. For example, steam pipes may be built between preexisting utility plant 101 and a newly constructed fluid plant 102 and may be connected to already existing steam turbines 110. Utility plant 101 may have been constructed without any prior knowledge or plans for the construction of data center 103 adjacent utility plant 101. For example, in one exemplary embodiment, utility plant 101 may have been constructed before the beginning of construction (i.e., breaking of ground) of data center 103. In yet another embodiment, utility plant 101 may have been commissioned before the beginning of construction of data center 103. In yet another embodiment, utility plant 101 may have received regulatory approval before the beginning of construction of data center 103. In yet another embodiment, the builders and/or owners of utility plant 101 may have submitted plans for utility plant 101 for regulatory approval before the beginning of construction of data center 103. In still further embodiments, utility plant 101 may have been constructed, commissioned or received regulatory approval and/or plans for utility plant 101 may have been submitted for regulatory approval at least 2 years or at least 5 years before the beginning of construction of data center 103. In these and/or other embodiments, the plans for utility plant 101 submitted for regulatory approval may have not included pipes or other means for transporting heating fluid from utility plant 101 to fluid plant 102. The builders and/or owners of utility plant 101, at the time of planning for and/or constructing utility plant 101, may have had no plan or intention to divert heating fluid from utility plant 101 to fluid plant 102 for use in cooling data center 103.

Utility plant 101 is generally configured to use coal, nuclear power, municipal solid waste, refuse-derived fuel, oil, natural gas, or another source of energy to generate electrical power. The fuel is burned to boil water to produce steam which in turn drives steam turbines mechanically coupled to electric generators. In this manner, energy stored in the fuel is converted to electrical energy. The steam turbines may have multiple stages, sometimes designated as high-pressure, intermediate-pressure and low-pressure stages. Unless the turbine is a backpressure turbine, in which exiting steam is diverted to a heat-dependent process, most of the exiting steam typically is converted to water in a condenser when it exits the low-pressure stage. Regardless of the type of turbine or number of stages, some steam can be extracted to provide energy to processes within utility plant 101 or outside. Of course, this process is not 100% efficient. At least some of the energy stored in the fuel is lost in the form of waste byproducts, including exhaust gas and low-value steam. Low-value steam is steam that is low in temperature and/or pressure and is of limited usefulness for generating electric power. Low-value steam may have a pressure of 30 pounds per square inch gauge (psig) or lower. In some cases steam having a pressure higher than 30 psig may still be considered low-value steam.

Utility plant 101 includes one or more utility boilers 105 configured to boil water to produce steam for use in generating electrical power. Steam produced by utility boilers 105 is sent to one or more steam turbines 110 that are configured to use the thermal energy from the steam to drive electric generators (not shown in FIG. 1E). Exhaust steam from steam turbines 110 is sent to condensers 145, which convert the exhaust steam to condensate. Water from cooling towers or a river or lake (not shown in FIG. 1E) is circulated through condensers 145 to convert steam at the fluid inlet to condensate at the fluid outlet. The condensate may be sent to utility boilers 105 for use in generating more steam.

Steam turbines 110 may have a plurality of stages, each of which may correspond to a particular level of steam pressure. In some embodiments, steam turbines 110 may have a high-pressure stage at which the pressure of the steam contained therein is high, an intermediate-pressure stage at which the pressure of the steam contained therein is at an intermediate level, and a low-pressure stage at which the pressure of the steam contained therein is low. Steam turbines 110 may have existing extraction ports through which steam can be extracted at one or more stages. Use of existing extraction ports, if available, may be desirable as steam can be extracted without modifying the turbine casings of steam turbines 110. If steam turbines 110 do not have existing extraction ports at a particular stage, new extraction ports may be added to an existing turbine casing of steam turbines 110. Additionally, in some embodiments, steam may be extracted from one or more steam manifolds, such as steam manifolds between steam turbines 110 and condensers 145. In the exemplary embodiment shown in FIG. 1E, low-pressure steam is extracted from extraction ports at the low-pressure stage of steam turbines 110 and sent to water plant 102 via steam pipes 115. This low-pressure steam may otherwise be used for heating boiler feedwater or performing other functions internal to utility plant 101. In other embodiments, steam may be extracted from the intermediate-pressure or high-pressure stages of steam turbines 110. In such embodiments, the intermediate-pressure or high-pressure steam may be mixed with water to reduce the pressure so that the steam can be used by fluid coolers 120.

In the exemplary embodiment illustrated in FIG. 1E, the heating fluid provided by utility plant 101 to fluid plant 102 is steam. In other exemplary embodiments, the heating fluid may be another type of fluid, such as hot water. One such exemplary embodiment, in which the heating fluid is hot water, is described herein with reference to FIG. 1G.

Referring still to FIG. 1E, fluid plant 102 is generally configured to receive heating fluid from utility plant 101, use the heating fluid to cool a cooling fluid, and send the cooling fluid to data center 103 for use in cooling electrical components 130. The cooling fluid may be any type of fluid capable of absorbing and transporting heat, such as water, glycol, ammonia, brine, etc. The cooling fluid may be a liquid or a gas. In the exemplary embodiment illustrated in FIG. 1E, steam sent from utility plant 101 via steam pipes 115 is received by one or more fluid coolers 120. Fluid coolers 120 use energy from the steam or hot water to cool the cooling fluid. The cooling fluid is sent to data center 103 via fluid pipe 125 and is used to dissipate heat generated by electrical components 130. Once the cooling fluid has been used to dissipate the heat, fluid coolers 120 receive the cooling fluid back from data center 103 via fluid pipe 135 to be cooled again. Condensate may be produced by the fluid cooling process and may be sent to utility plant 101 via condensate pipe 140 for use, for example, as feedwater for utility boilers 105 or, through a closed circuit heat exchanger, to heat feedwater for utility boilers 105. Fluid plant 102 may also include an auxiliary boiler 150 configured to generate steam to supplement or replace the steam supplied by utility plant 101. This may be useful in the event utility plant 101 cannot supply an adequate amount of steam to run fluid coolers 120 or if steam turbines 110 are not running due to scheduled or unscheduled maintenance.

In the exemplary embodiment illustrated in FIG. 1E, fluid coolers 120 are absorption chillers. The absorption chillers receive low-pressure steam from utility plant 101 via steam pipes 115 and use the energy from the low-pressure steam to cool the cooling fluid using a thermal compressor. Absorption chillers may be an economical choice for fluid coolers 120 because they can use low-pressure waste steam, or steam that is generally considered lower-grade steam and is less useful to utility plant 101, to cool the cooling fluid. In some embodiments, the steam provided to fluid coolers 120 may have a pressure less than about thirty pounds per square inch gauge (psig). Absorption chillers are often configured to use steam having a pressure in this range to drive the fluid cooling process. In other embodiments, absorption chillers may be configured to use steam having a pressure higher than thirty psig or hot water to cool the cooling fluid.

Furthermore, in still other exemplary embodiments, fluid coolers 120 may be other kinds of coolers configured to use heating fluid to cool the cooling fluid. For example, fluid coolers 120 may be adsorption chillers which utilize a carrier material such as silica-gel to cool the cooling fluid. In other embodiments, fluid coolers 120 may be steam-driven chillers configured to cool the cooling fluid using higher-pressure steam. Steam may be extracted from the intermediate-pressure stage of steam turbines 110 and delivered to the steam-driven chillers. Energy from the intermediate-pressure steam may then be used by the steam-driven chillers to cool the cooling fluid. In still further embodiments, fluid coolers 120 may use an energy input from utility plant 101 other than steam to drive the fluid cooling process, such as boiler feedwater, condenser water or cooling tower water.

Figure 1F:
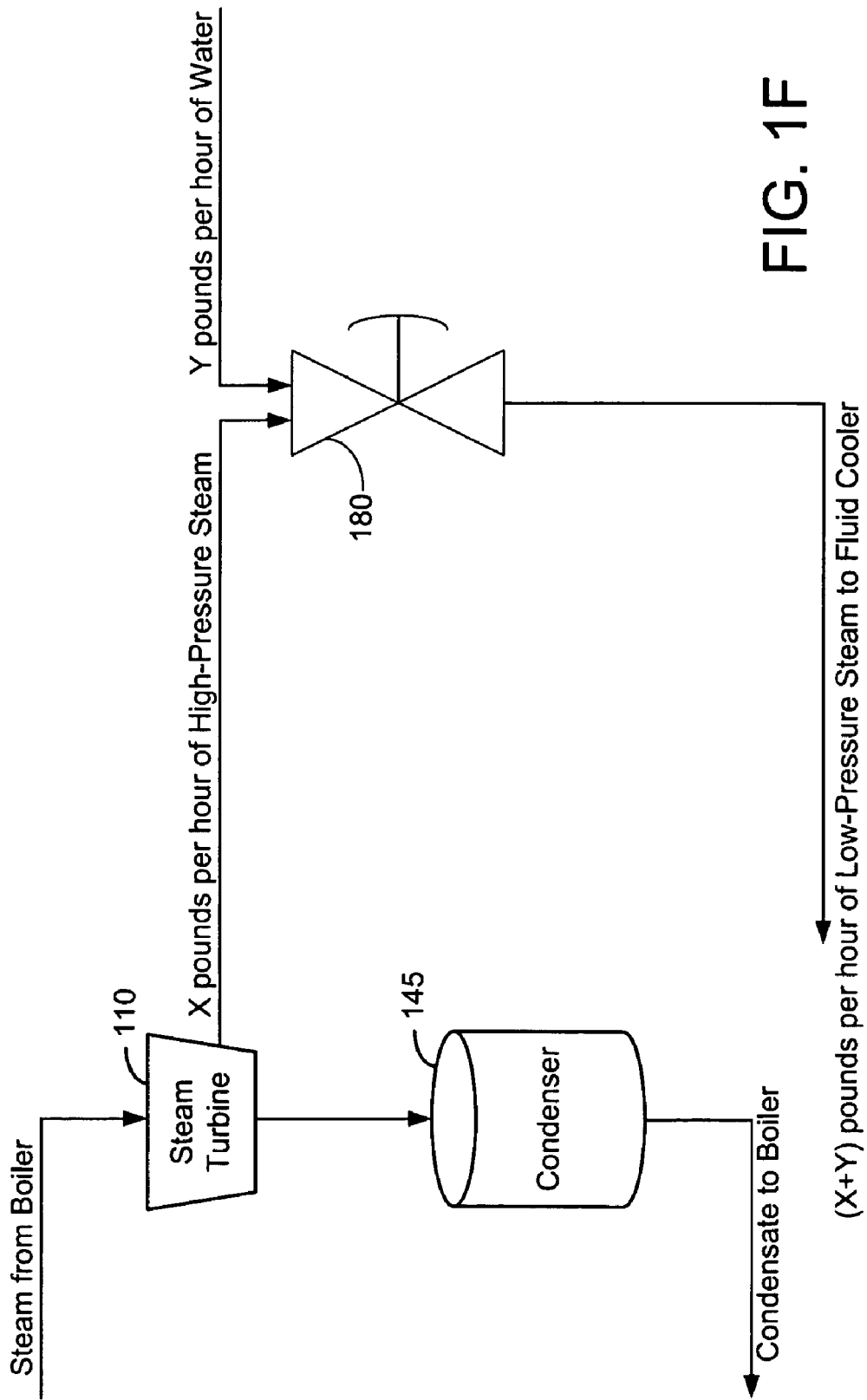
FIG. 1F is a block diagram of a steam attemperation system, according to an exemplary embodiment.

Referring now to FIG. 1F, a block diagram of a steam attemperation system is shown, according to an exemplary embodiment. In some embodiments, steam extracted from steam turbines 110 may have a higher pressure than fluid coolers 120 are configured to receive. In such a case, the steam may be attemperated to achieve a desired pressure and quantity for delivery to fluid coolers 120. Steam may be extracted at the high-pressure or medium-pressure stages of steam turbine 110 and sent to valve 180. In the illustrated embodiment, valve 180 adds Y pounds per hour of water to X pounds per hour of high-pressure steam to generate X plus Y pounds per hour of low-pressure steam. Valve 180 then sends this low-pressure steam to fluid coolers 120. In some embodiments valve 180 may be an attemperator valve. An attemperator valve is configured to receive the steam as well as water and add the water to the steam to produce low-pressure steam. An attemperator valve regulates the amount of water added to the steam to produce a desired temperature, pressure and quantity of lower-pressure steam. In other embodiments, valve 180 may be a sparging valve. A sparging valve is configured to receive steam and water and add steam to the water to produce low-pressure steam. A sparging valve regulates the amount of steam added to the water to produce a desired temperature, pressure and quantity of low-pressure steam.

Figure 1G:
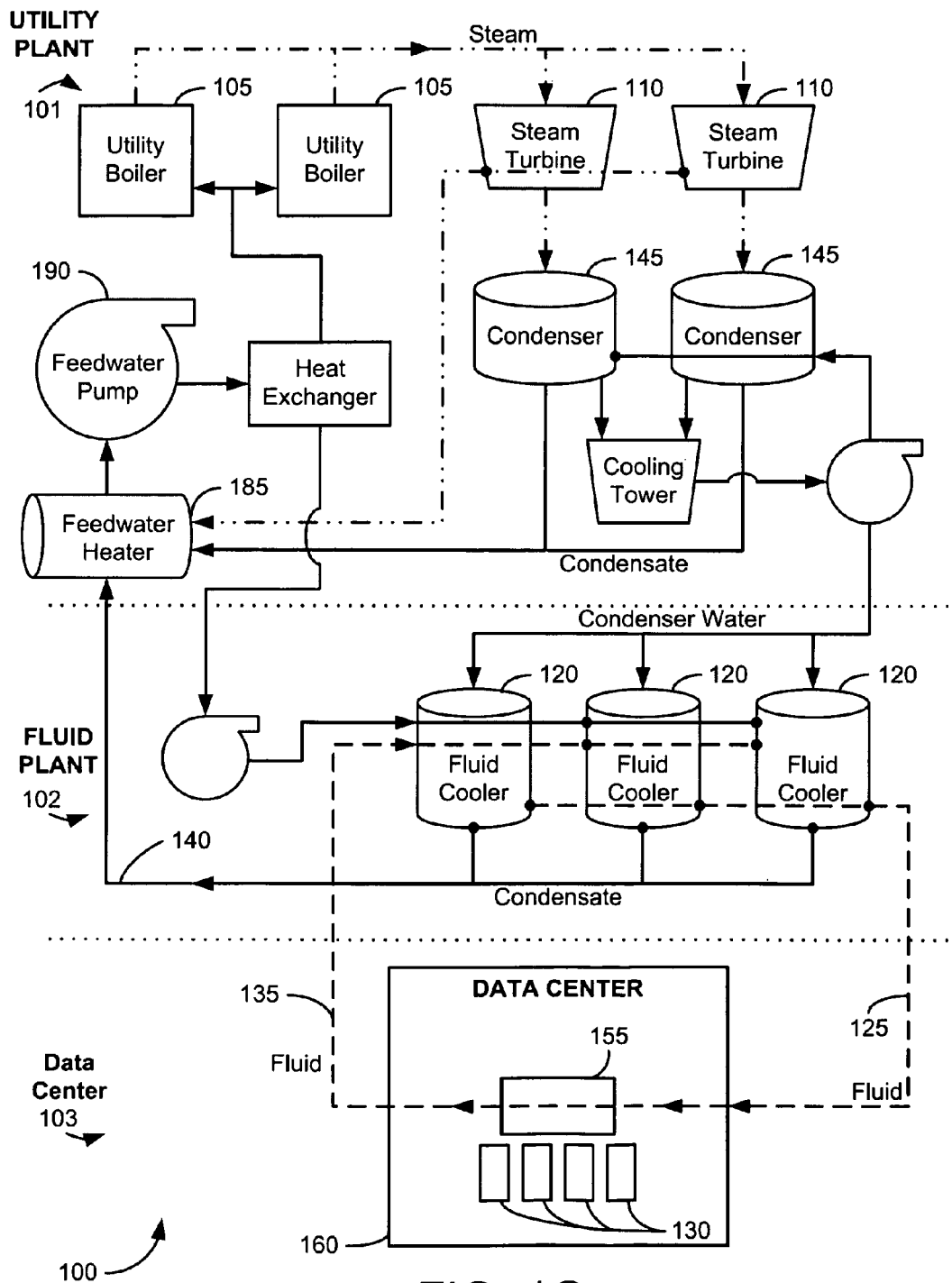
FIG. 1G is a block diagram of a utility plant and a data center cooling system that uses hot water as a heating fluid, according to an exemplary embodiment.

Referring now to FIG. 1G, a block diagram of a utility plant and a data center cooling system that uses hot water as a heating fluid is shown, according to an exemplary embodiment. The cooling fluid may be sent from fluid plant 102 to data center 103 and used to cool data center 103 in the same way as in the exemplary embodiment of FIG. 1E. In the exemplary embodiment shown in FIG. 1G, the heating fluid sent to fluid coolers 120 is hot water instead of steam. Utility plant 101 includes utility boilers 105, steam turbines 110 and condensers 145. According to this embodiment, utility plant 101 also includes feedwater heater 185 and feedwater pump 190. Feedwater heater 185 provides heated feedwater for use by utility boilers 105. Feedwater heater 185 may receive condensate from condensers 145, fluid coolers 120 and/or other sources. Feedwater heater 185 may use steam from steam turbines 110, utility boilers 105 and/or other sources to heat the feedwater. Feedwater pump 190 pumps feedwater from feedwater heater 185 to utility boilers 105. In the illustrated exemplary embodiment of FIG. 1G, feedwater pump 190 also pumps feedwater to fluid coolers 120. In other exemplary embodiments, hot water from other sources in utility plant 101 may be used as the heating fluid for use by fluid coolers 120. In some embodiments, the pump that sends water from feedwater heater 185 to fluid coolers 120 may be a different pump than the pump that sends water from feedwater heater 185 to utility boilers 105. In some embodiments, fluid coolers 120 may be the same fluid coolers as used in the exemplary embodiment of FIG. 1E and may be configured to use either steam or hot water to cool the cooling fluid. In other embodiments, fluid coolers 120 may be different fluid coolers and may be specifically configured to use hot water to cool the cooling fluid.

Referring now to FIGS. 2A through 2C, process flow diagrams 200, 201 and 202 illustrate a data center cooling process that may be executed using the various structures disclosed above with reference to FIG. 1E, according to an exemplary embodiment. FIG. 2A illustrates steps that may be executed at utility plant 101. FIG. 2B illustrates steps that may be executed at water plant 102. FIG. 2C illustrates steps that may be executed at data center 103. However, in other exemplary embodiments one or more of the steps may be executed by different elements described above with reference to the exemplary embodiment shown in FIG. 1E.

Referring now specifically to FIG. 2A, process flow diagram 200 illustrates a process that may be executed at utility plant 101, according to an exemplary embodiment. At step 205, utility boilers 105 generate steam and send the steam to steam turbines 110. At step 210, steam is extracted from steam turbines 110. In one embodiment, the steam extracted at step 210 may be low-pressure steam extracted from the low-pressure stage of steam turbines 110. The low-pressure steam may be extracted through an existing extraction port, a new extraction port added to an existing turbine casing, a steam manifold, etc. At step 215, the steam extracted at step 210 is sent to fluid coolers 120 through steam pipes 115.

Referring now specifically to FIG. 2B, process flow diagram 201 illustrates a process that may be executed at water plant 102, according to an exemplary embodiment. At step 220, steam extracted from steam turbines 110 is received by fluid coolers 120 through steam pipes 115. Fluid coolers 120 then use the steam at step 225 to cool fluid. At step 230, any condensate produced by fluid coolers 120 during the cooling process may be sent to utility plant 101 for use, for example, as feedwater for utility boilers 105. At step 235, the cooling fluid cooled at step 225 is sent to the data center for use in cooling electrical components 130.

Referring now specifically to FIG. 2C, process flow diagram 202 illustrates a process that may be executed at data center 103, according to an exemplary embodiment. At step 240, cooling fluid is received from fluid coolers 120 by cooling system 155 via fluid pipe 125. Cooling system 155 uses the cooling fluid at step 245 to dissipate heat from electrical components 130. Once cooling system 155 has finished using the cooling fluid to dissipate the heat, it returns the water to fluid coolers 120 at step 250 to be cooled again.

The exemplary process illustrated in FIGS. 2A through 2C may include different or additional steps in some embodiments. For example, fluid coolers 120 may be absorption chillers configured to cool fluid using low-pressure steam and may have a maximum input steam pressure above which the absorption chillers may not operate properly. Steam received from utility plant 101 may not be low-pressure have a pressure higher than this maximum pressure. In this embodiment, process flow diagram 201 may include an attemperation step between steps 220 and 225 to lower the pressure of the steam received at step 220. At this attemperation step, water may be added to the steam until the desired steam quantity, temperature and/or pressure for input to fluid coolers 120 is attained. The water may be added using a spray valve or other device configured to control the amount of water added to the steam. In other embodiments, a sparging step may be included rather than an attemperation step, wherein steam may be introduced directly to the cooling fluid returning from data center 103 through fluid pipe 135 to create steam having a desired pressure for use by fluid coolers 120. In still further embodiments, steps 205 through 230 may be modified to use hot water as the heating fluid. For example, step 210 may be modified to extract hot water from feedwater heater 185 or feedwater pump 190 and step 215 may be modified to send hot water to fluid coolers 120.

Figure 3:
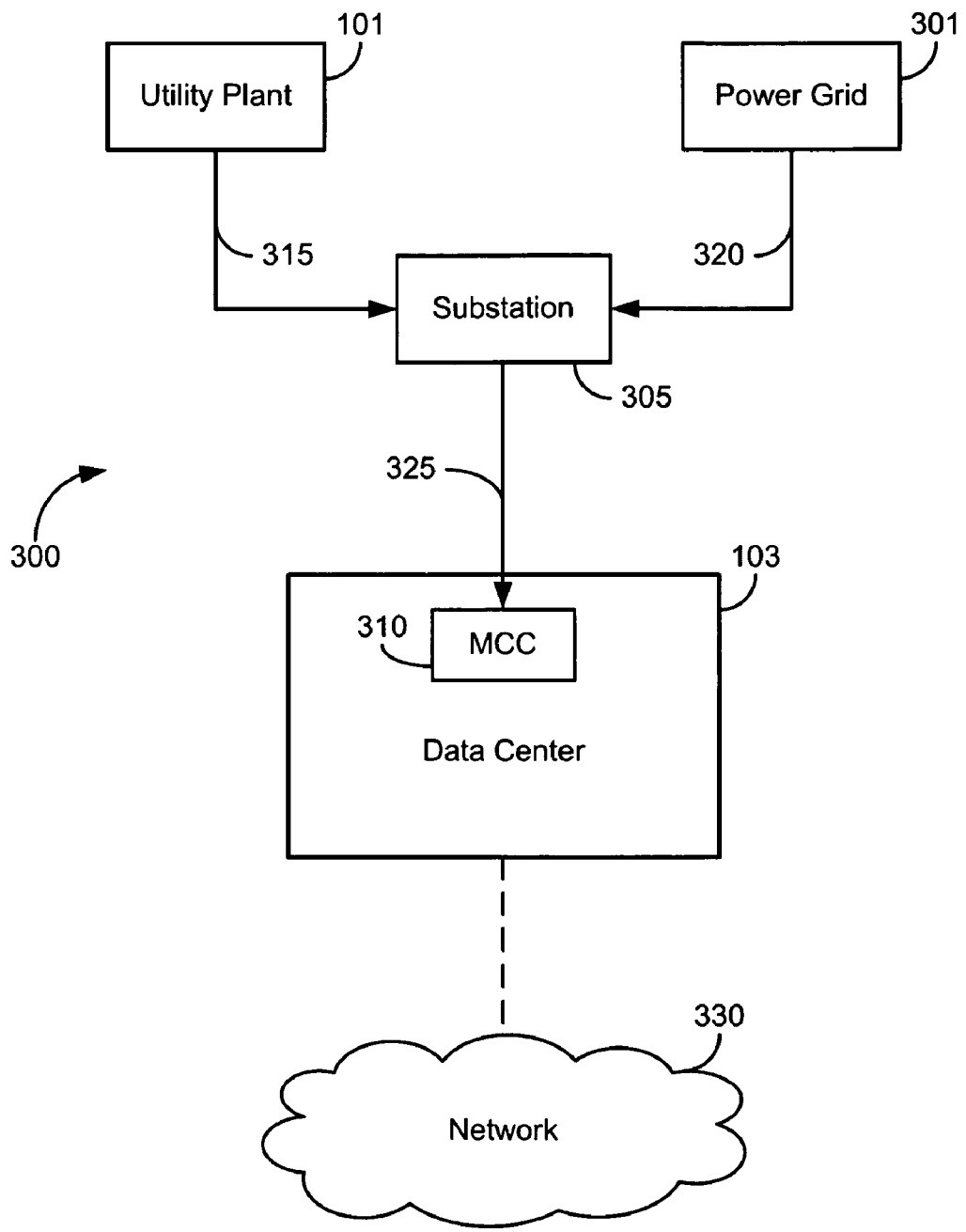
FIG. 3 is a block diagram of an electric power system for the data center shown in FIG. 1E, according to an exemplary embodiment.

Referring now to FIG. 3, an electrical system 300 for use in providing power to data center 103 is illustrated, according to an exemplary embodiment. Electrical system 300 includes an electrical substation 305 configured to receive electrical power from utility plant 101 and power grid 301 and transmit electrical power to data center 103. Power grid 301 is an electric power transmission network configured to facilitate the transmission of electric power from one location to another. Power grid 301 may be a transmission voltage power grid and may receive and transmit electrical power at voltages at or above 15,000 volts. For longer distances, typical voltages may be in the range of 155,000 to 345,000 volts. Power grid 301 may receive electric power from several utility plants and distribute the power based on demand, shortage of supply, etc. Power grid 301 may be a multi-state power grid, i.e., a grid that spans multiple states and that transmits power across state lines (e.g., from Wisconsin to Illinois or vice versa).

Electrical substation 305 receives electrical power directly from utility plant 101 via primary power line 315. Electrical power delivered via primary power line 315 does not pass through the power grid. Rather, primary power line 315 is a direct electrical bus from utility plant 101 to data center 103, through which data center 103 receives electrical power directly from utility plant 101. Because data center 103 and utility plant 101 are located adjacent to one another and primary power line 315 forms a direct electrical connection between them, there may be little transmission or distribution line losses and energy efficiency may be increased. Electrical substation 305 receives electrical power from power grid 301 via secondary power line 320. While power lines 315 and 320 are depicted in FIG. 3 as singular power lines, in other embodiments multiple power lines may be used to deliver power to electrical substation 305 from either utility plant 101 or power grid 301. For example, data center 103 may receive power from power grid 301 via two electrical lines 320, each of which may or may not be connected at a different point in power grid 301.

Electrical substation 305 may include a transformer to transform the voltage of the electric power received via power lines 315 and 320 either up or down for use by data center 103. Electrical substation 305 may also include switchgear used to isolate electrical equipment. While receiving electrical feeds from multiple sources (utility plant 101 and power grid 301) may reduce the need for additional redundant power sources, in some embodiments electrical substation 305 may have redundant power sources such as generators driven by diesel engines, gasoline engines, gas turbines, deep cycle batteries, fuel cells, etc. Elements housed in electrical substation 305 may generate heat, and they may also be cooled using data center cooling system 100 described above with reference to the exemplary embodiment illustrated in FIG. 1E.

Electrical substation 305 transmits electrical power to data center 103 via data center electrical line 325 for use in powering electrical components 130. The electrical power may be received at a motor control center 310 of data center 103. Data center 103 is also connected to computing network 330. Computer network 330 may be a computing network such as the Internet, a wide area network, and other types of computing networks. Computing network 330 may be connected to one or more computer servers and/or other electrical devices in data center 103.

In one embodiment, electrical substation 305 may use electrical power from utility plant 101, received via primary electrical line 315, as the primary source of power for data center 103. That is, electrical substation 305 may only use electrical power from power grid 301, received via secondary electrical line 320, as a backup power source in the event utility plant 101 is unable to supply electrical power (such as during a scheduled or unscheduled downtime). Barring such a time in which the utility plant is unable to supply power, data center 103 would utilize power received directly from utility plant 101 via primary electrical line 315 as its main source of power at all times. This embodiment provides utility plant 101 with the benefit of receiving a captive, reliable electrical customer that has a high electrical load factor in return for the use of its steam. In alternative embodiments, electrical substation 305 may use power from power grid 301 or another source as the primary source of power for data center 103, or electrical substation 305 may use power from multiple sources to power data center 103.

Figure 4:
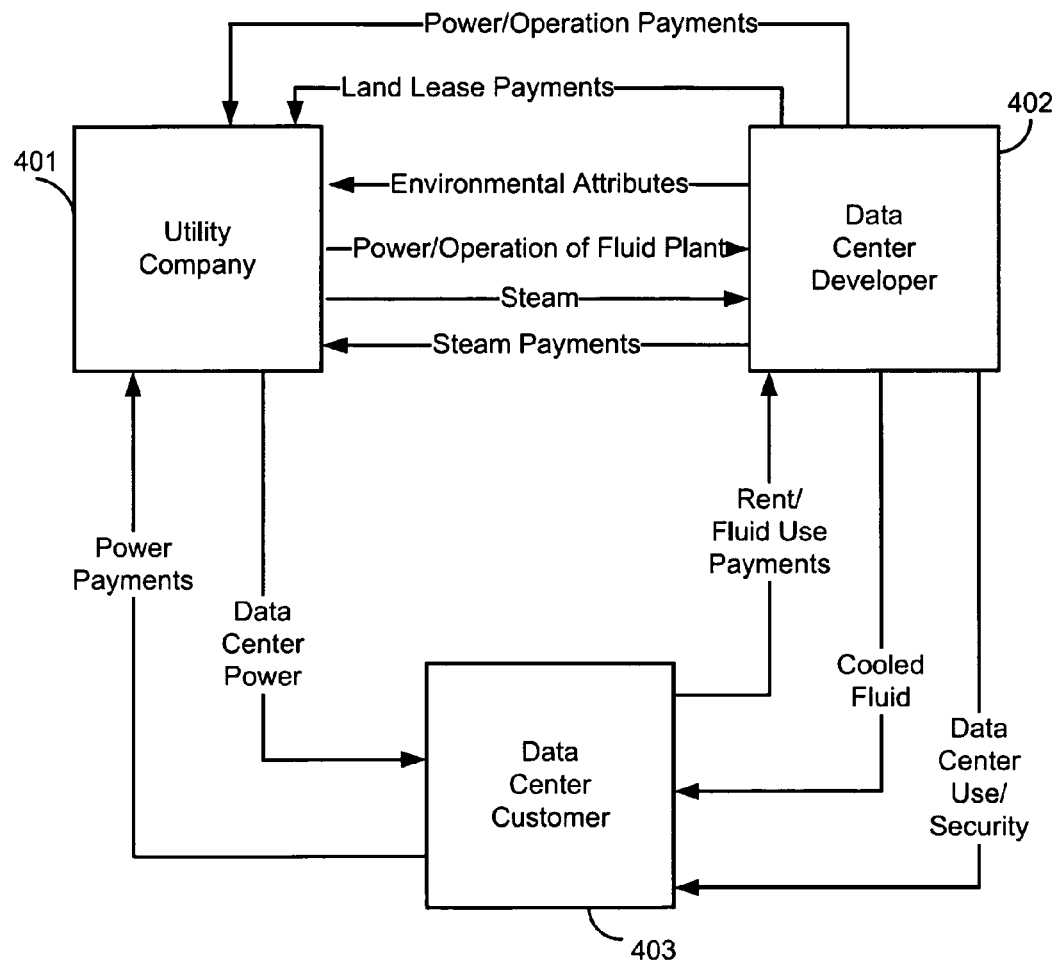
FIG. 4 is a block diagram of the ownership and operation of the data center cooling system and electric power system shown in FIGS. 1E and 3, according to an exemplary embodiment.

Referring now to FIG. 4, a block diagram of the ownership and operation of the data center cooling system and electric power system shown in FIGS. 1 and 3 is illustrated, according to an exemplary embodiment. Ownership and operation of the cogeneration system according to the exemplary embodiment shown in FIG. 4 involves a utility company 401, a data center developer 402, and one or more data center customers 403. Utility company 401 may be any individual or entity that owns a plant that produces electrical energy such as utility plant 101 shown in FIGS. 1 and 3. Data center developer 402 is an individual or entity that develops, owns and manages a data center such as data center 103 shown in FIGS. 1 and 3. Data center customers 403 may be entities that pay to place servers in the data center. Data center customers 403 may use the data center to provide services such as search engines, on-line shopping, on-line banking, on-line media distribution (e.g., online movies, online newspapers/magazines, on-line music downloads, online radio broadcasting, and so on), on-line file storage (FTP file transfer, etc.), on-line gaming, and so on. In some embodiments, data center developer 402 and data center customers 403 may be the same entity or entities (i.e., one entity could both develop the data center and use the data center itself).

Data center developer 402 arranges for an investment of capital or money to develop, own and manage the data center, fluid plant and fluid pipes connecting the utility plant to the fluid plant. Data center developer 402 may purchase or lease space on property owned by utility company 401 to build the data center and/or fluid plant, or data center developer 402 may build the data center and/or fluid plant on property near the utility plant. Once the data center and fluid plant are complete, data center developer 402 leases space in the data center to one or more data center customers 403. Data center customers 403 use the data center in exchange for paying rent to data center developer 402. Data center customers 403 also receive cooling fluid from the fluid plant to cool electronic components contained in the data center. In return, data center customers 403 may also pay a fee for cooled fluid usage to data center developer 402. Data center developer 402 may also provide security for data center customer 403, which data center customer 403 may also pay for.

Data center customers 403 receive electric power from the utility plant owned by utility company 401. In return, data center customers 403 pay utility bills to utility company 403 for the power received. In the exemplary embodiment illustrated in FIG. 3, data center customers 403 may pay a favorable rate for power because there is no distribution associated with serving the data center (due to the direct electrical connection formed by primary electrical line 315) and power transmitted via power grid 301 would only be used as backup power in the event the utility plant is unable to provide power. In some embodiments, data center developer 402 may pay utility company 403 for the power received and charge data center customers 403 a prorated amount for power. Data center developer 402 may also add some margin onto the prorated power charges.

Data center developer 402 receives electric power and steam to operate the fluid plant and common areas of the data center from the utility plant owned by utility company 401. In return, data center developer 402 pays utility company 401 for the use of the power. Data center developer 402 may also pay for the use of the steam. Data center developer 402 may also pay utility company 401 to operate the fluid plant. In exchange for the payment, utility company 401 may provide operation and maintenance resources and personnel to operate the fluid plant. If the data center is constructed on land owned by utility company 401, data center developer 402 may also pay utility company 401 to lease and/or purchase the land. By entering into this relationship, data center developer 402 reduces construction and operating costs for the benefit of data center customers 403. Utility company 401 receives the benefit of capturing a desirable, reliable customer with a high load factor.

Additionally, the disclosed cogeneration system may produce environmental attributes beneficial to the parties. By using fluid to cool the electrical components, the energy required to cool the data center may be reduced by twenty percent or more. Because there are no transmission or distribution line losses, energy efficiency may be increased by up to five percent.

Also, as a result of efficiency improvements, carbon emissions (e.g., carbon dioxide, carbon monoxide, etc.) may be reduced. The benefits to utility company 401 and/or data center developer 402 associated with reduced carbon emissions may be based in part on standards or systems established by government or other central bodies authorized to establish environmental standards.

One applicable system may be a cap and trade system under which the reduction in carbon emissions may allow utility company 401 and/or data center developer 402 to obtain or capture carbon emission avoidance allowances or credits, or carbon credits. Carbon credits are based on carbon emission reductions certified by a central body which is authorized to issue such credits. If an entity's actual carbon emissions are below a permitted amount, the entity may obtain carbon credits based on the difference between the actual and permitted emissions. These carbon credits may be traded, for example, with other entities whose actual emissions exceed their permitted emissions. The carbon credits may be traded in markets established for the trade of carbon credits. One such market, for example, is the Chicago Climate Exchange. In different embodiments, the number of carbon credits which may be obtained by using the disclosed cogeneration system may be determined based on different calculations. For example, in one embodiment, the credits may be determined based on the difference in carbon emission between the cogeneration system and a typical data center power system that uses electrical power to drive electric chillers and has on-site diesel backup generators. In other embodiments, carbon credits may be determined based on other calculations.

Another applicable system may be a carbon tax system, under which an entity is charged a tax for its carbon emissions. A carbon tax system may charge entities a tax for all carbon emissions or for any carbon emissions above a certain amount. Under a carbon tax system, the cogeneration system would benefit utility company 401 and/or data center developer 402 because less carbon emissions would be produced under the cogeneration system than under the typical electric chiller system and, accordingly, utility company 401 and/or data center developer 402 would pay a lower tax.

Yet another applicable system may be involve renewable portfolio standards (RPS) enforced by the government that require utility companies to generate a certain amount of electrical power using renewable energy sources. Some states have adopted a mandatory RPS while others have adopted a voluntary RPS. Each enacted RPS defines what resources qualify as contributing to the requirements under the standard. The cogeneration system may qualify, and utility company 401 may be able to use the cogeneration system to fulfill its obligations under an RPS. While cap and trade, carbon tax and RPS systems have been described, it should be appreciated that other carbon emission systems may also be applicable and the disclosed cogeneration system may produce benefits for utility company 401 and/or data center developer 402 under those systems as well.

In some embodiments, data regarding carbon emissions, carbon credits, carbon taxes, renewable portfolio standards, etc. may be stored, tracked and/or displayed using a computing system. A computer may be configured to execute instructions and store and access data in a memory to store and/or track data related to the carbon emissions and carbon credits attributable to utility company 401 and/or data center developer 402. In certain embodiments the computer may be configured to perform calculations to analyze and trend carbon emissions and credits over time, determine the quantity of carbon emissions and credits that are attributable to certain parts of the cogeneration system, generate visual representations of data related to carbon emissions and credits, etc. Visual representations of data related to carbon emissions and credits may be displayed to a user on a display.

Other beneficial environmental attributes may result from use of the cogeneration system as well. Many of these environmental attributes may be shared or passed along to utility company 401 by data center developer 402. In many states, cogeneration technology is eligible for inclusion in a utility's renewable energy portfolio. Furthermore, use of the cogeneration system may allow utility company 401 to add a valuable electric customer without negatively impacting emissions from the utility plant.

It is important to note that the construction and arrangement of the elements of the cooling system are illustrative only. Although only a few exemplary embodiments of the present disclosure have been described in detail in this disclosure, those skilled in the art who review this disclosure will readily appreciate that the common element in these embodiments is the close connection made between an existing utility plant and a new data center that is constructed nearby so as to minimize transmission loss associated with supplying electrical energy to the data center and cogenerate cooling fluid for the data center at the utility plant, thereby improving overall efficiency of the utility plant, and many modifications are possible in these embodiments (such as variations in components, fluid cooler input substances, cooling fluid substances, orientation, configuration and location of cooling system components, variations in sizes, structures, shapes, dimensions and proportions of components of the cooling system, use of materials, distance between components, etc.) without materially departing from the novel teachings and advantages of the disclosure. For example, fluid coolers 120 may not be located in a separate fluid plant but may be located at the utility plant. In some embodiments, the cooling system may have more, less or different components than shown in the exemplary embodiments. For example, in some embodiments, the cooling system may work in conjunction with another type of cooling system, such as an air conditioner or heat exchanger. In other embodiments, the fluid-based cooling system might be used during some times of the year, environmental conditions, etc. and an alternative cooling system may be used during other times or conditions. For example, a data center located in a climate that experiences cold winter months may use the fluid-based cooling system during warm months and a heat exchanger-based system to utilize the cold air during colder months. Accordingly, all such modifications are intended to be within the scope of the disclosure.

Furthermore, various components of the cooling system may be constructed, owned and maintained by various different entities. For example, the data center developer may construct the data center, fluid plant and electrical substation. The data center developer may construct these components on utility property, or on separate property substantially adjacent to utility property. The data center developer may own and maintain the data center, fluid plant and electrical substation and charge a customer who uses the data center rent and for cooling fluid usage. In other embodiments, the fluid plant and electrical substation may be owned and/or maintained by the utility. If the electrical substation is owned by the data center developer, the electrical charges may be lower as the data center developer and/or the data center customer would be primary power customers rather than secondary power customers. Other combinations of construction, ownership and maintenance of the various components of the cooling system may be used without departing from the spirit of the disclosure.

The order or sequence of any process or method steps may be varied or resequenced according to alternative embodiments. Other substitutions, modifications, changes, and omissions may be made in the design, operating configuration and arrangement of the preferred and other exemplary embodiments without departing from the spirit of the disclosure.

What is claimed is:

1. A method of retrofitting a utility plant comprising:
constructing a data center within three miles of the utility plant, the utility plant distributing an average of at least fifty percent of the electrical power it generates to a power grid, the utility plant having been commissioned before the construction of the data center begins;
installing a first pipe system configured to divert a heating fluid from the utility plant to a fluid plant that uses the heating fluid to produce a cooling fluid; and installing a second pipe system to connect the fluid plant to a data center and to circulate the cooling fluid between the fluid plant and the data center;

wherein the steps of constructing the data center, installing the first pipe system, and installing the second pipe system are performed as a retrofit to the utility plant, such that plans for the utility plant submitted for regulatory approval before the utility plant was commissioned do not include the data center, the first pipe system, or second pipe system; and wherein the data center comprises electrical components including a plurality of servers, the electrical components contained in the data center generating heat that is dissipated using the cooling fluid, the computer servers being configured to execute instructions and store and access data in a memory, wherein the computer servers are connected to a computing network.

2. The method of claim 1, wherein the data center is located within a distance of about one mile from the utility plant.

3. The method of claim 1, wherein the data center is located on property owned by an owner of the utility plant.

4. The method of claim 1, further comprising configuring the data center to receive electric power via at least one of an electrical line from the utility plant that does not pass through the power grid and an electrical line from the power grid, wherein electric power from the power grid is used if electric power from the utility plant is unavailable, and wherein the data center is not provided with a separate backup generator.

5. The method of claim 1, further comprising configuring the data center to receive electric power via two electrical lines from the power grid.

6. The method of claim 1, wherein the cooling fluid is water.

7. The method of claim 1, wherein the heating fluid is steam.

8. The method of claim 1, wherein the heating fluid is hot water.

9. The method of claim 1, wherein the heating fluid is low pressure steam extracted from a steam turbine.

10. The method of claim 9, wherein a pressure of the low pressure steam is less than about thirty pounds per square inch gauge.

11. The method of claim 9, wherein the low pressure steam used to cool the cooling fluid is steam that, prior to the retrofitting, is used for heating boiler feedwater.

12. The method of claim 1, wherein the cooling fluid is cooled using an absorption chiller.

13. The method of claim 12, wherein the heating fluid is steam, wherein a pressure of the steam is higher than a maximum pressure of the absorption chiller, wherein water is added to the steam until the pressure of the steam is lower than the maximum pressure of the absorption chiller.

14. The method of claim 12, wherein the heating fluid is steam, wherein a pressure of the steam is higher than a maximum pressure of the absorption chiller, wherein the pressure of the steam is reduced by introducing the steam to cooling fluid returned from the data center until it is lower than the maximum pressure of the absorption chiller.

15. The method of claim 1, wherein the cooling fluid is cooled using a steam-driven chiller.

16. A system comprising:

an enclosure located adjacent to a utility plant and configured to contain a plurality of electrical components, wherein the utility plant is a preexisting utility plant that was commissioned before the beginning of construction of the enclosure, wherein the utility plant operates on average at least eighty percent of the time, the electrical components including a plurality of computer servers, the computer servers being configured to execute instructions and store and access data in a memory, wherein the computer servers are connected to a computing network; and a cooling system configured to dissipate heat from the electrical components using a cooling fluid, wherein the cooling fluid is received from a fluid cooler configured to cool the cooling fluid using thermal energy obtained from a heating fluid, wherein the heating fluid is received by the fluid cooler from the utility plant;

wherein the utility plant is retrofitted to provide heating fluid to the fluid cooler, such that plans for the utility plant submitted for regulatory approval before the utility plant was commissioned do not include a pipe system configured to transport heating fluid from the utility plant to the fluid cooler.

17. The system of claim 16, wherein the enclosure is located within a distance of about three miles from the utility plant.

18. The system of claim 16, wherein the electrical components are powered using electric power received via at least one of an electrical line from the utility plant that does not pass through the power grid and an electrical line from the power grid, wherein electric power from the power grid is used if electric power from the utility plant is unavailable, the electric power from the power grid being used as back up instead of power from a backup generator.

19. The system of claim 16, wherein the heating fluid is low pressure steam extracted from a steam turbine.

20. The system of claim 19, wherein a pressure of the low pressure steam is less than about thirty pounds per square inch gauge.

21. The system of claim 16, wherein the fluid cooler is an absorption chiller.

22. The system of claim 16, wherein the heating fluid is steam, wherein a pressure of the steam is higher than a maximum pressure of the fluid cooler, wherein water is added to the steam until the pressure of the steam is lower than the maximum pressure of the fluid cooler.

23. The system of claim 16, wherein the heating fluid is steam, wherein a pressure of the steam is higher than a maximum pressure of the fluid cooler, wherein the pressure of the steam is reduced by introducing the steam to fluid returned from the data center until it is lower than the maximum pressure of the absorption chiller.

24. A system for using steam from a utility plant, comprising:

a data center configured to contain a plurality of electrical components, the electrical components including a plurality of computer servers, the computer servers being configured to execute instructions and store and access data in a memory, wherein the computer servers are connected to a computing network, the data center being located adjacent to the utility plant at a distance less than about three miles from the utility plant, wherein the utility plant is a preexisting utility plant that was commissioned prior to the construction of the data center, wherein the utility plant operates on average at least eighty percent of the time, wherein the utility plant is configured to generate at least 50 Megawatts of electrical power, wherein the utility plant distributes an average of at least fifty percent of the electrical power it generates to a power grid;

a water plant, the water plant configured to receive low-pressure steam through steam pipes from the utility plant, the low-pressure steam having a pressure of less than about thirty pounds per square inch gauge, wherein the low-pressure steam is extracted from an extraction port at a low-pressure stage of a steam turbine in the utility plant, the water plant further configured to cool water with the low-pressure steam using absorption chillers, the water plant further configured to send the cooled water through water pipes to the data center, the water plant further configured to send condenser water from the absorption chillers to boilers in the utility plant;

a water cooling system configured to receive the water from the water plant and dissipate heat from the electrical components using the water, the water cooling system further configured to return the water to the water plant for cooling by the absorption chillers; and an electrical substation configured to receive electricity to power the electrical components, the electrical substation configured to receive electric power via at least one of an electrical line from the utility plant that does not pass through the power grid and an electrical line from the power grid, wherein electric power from the power grid is used if electric power from the utility plant is unavailable;

wherein construction of the steam pipes from the utility plant to the water plant are performed as a retrofit to the utility plant, such that plans for the utility plant submitted for regulatory approval before the utility plant was commissioned do not include the steam pipes from the utility plant to the water plant.

25. A method of using thermal energy from a utility plant, comprising:
- extracting heating fluid at the utility plant, the heating fluid being at least one of steam and hot water; and
- sending the heating fluid to a fluid cooler, the fluid cooler configured to use the heating fluid to cool water, the water being received by a data center located adjacent to the utility plant, the data center containing electrical components, the water being used to dissipate heat from the electrical components, the electrical components including a plurality of computer servers, the computer servers being configured to execute instructions and store and access data in a memory, wherein the computer servers are connected to a computing network;
- wherein at least fifty percent of the electrical power generated by the utility plant is used by consumers located greater than three miles from the utility plant, the utility plant having been commissioned before the beginning of construction of the data center, wherein the utility plant is retrofitted to send the heating fluid from the utility plant to the fluid cooler, such that plans for the utility plant submitted for regulatory approval before the utility plant was commissioned do not include a pipe for sending the heating fluid from the utility plant to the fluid cooler.

26. The method of claim 25, wherein the data center is located within a distance of about three miles from the utility plant.

* * * * *